(12) United States Patent
Schultz

(10) Patent No.: US 10,651,164 B2
(45) Date of Patent: May 12, 2020

(54) METAL ZERO CONTACT VIA REDUNDANCY ON OUTPUT NODES AND INSET POWER RAIL ARCHITECTURE

(71) Applicant: Advanced Micro Devices, Inc., Santa Clara, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/591,102

(22) Filed: Oct. 2, 2019

(65) Prior Publication Data

US 2020/0035662 A1 Jan. 30, 2020

Related U.S. Application Data

(62) Division of application No. 15/965,311, filed on Apr. 27, 2018, now Pat. No. 10,438,937.

(51) Int. Cl.
*H01L 27/02* (2006.01)
*H01L 21/8234* (2006.01)
(Continued)

(52) U.S. Cl.
CPC ........ *H01L 27/0207* (2013.01); *G06F 30/392* (2020.01); *G06F 30/394* (2020.01);
(Continued)

(58) Field of Classification Search
CPC .............. H01L 21/823431; H01L 21/823475
See application file for complete search history.

(56) References Cited

U.S. PATENT DOCUMENTS 5,889,329 A   3/1999  Rostoker et al.
9,837,398 B1  12/2017 Rowhani et al.
(Continued)

FOREIGN PATENT DOCUMENTS

WO   2007073599 A1   7/2007

OTHER PUBLICATIONS

Final Office Action in U.S. Appl. No. 15/819,879, dated Oct. 11, 2019, 12 pages.
(Continued)

*Primary Examiner* — Cuong Q Nguyen
(74) *Attorney, Agent, or Firm* — Kowert Hood Munyon Rankin and Goetzel PC; Rory D. Rankin

(57) ABSTRACT

A system and method for creating layout for non-planar cells with redundancy in one or more of output contacts and power contacts are described. In various implementations, cell layout is created for a first cell with non-planar devices. An available local path in the first cell is identified for redundant output signal routing, which includes a free available metal zero layer track. Redundant metal zero layer is placed in an available metal zero track of the available local path. Redundant contacts and redundant metal one layer are placed in a free track in the available local path to connect an original output contact to a redundant output contact. An available external path is identified between the first cell and a second cell for redundant power or ground routing. One or more metal zero extension layers and/or metal one extension layers are placed in the identified external path.

7 Claims, 9 Drawing Sheets

(51) Int. Cl.

| | | |
|---|---|---|
| *H01L 23/528* | (2006.01) | |
| *H01L 23/522* | (2006.01) | |
| *H01L 29/423* | (2006.01) | |
| *H01L 27/088* | (2006.01) | |
| *G06F 30/392* | (2020.01) | |
| *G06F 30/394* | (2020.01) | |
| *H01L 29/66* | (2006.01) | |
| *H01L 29/45* | (2006.01) | |

(52) U.S. Cl.
CPC ........... *H01L 21/823431* (2013.01); *H01L 21/823437* (2013.01); *H01L 21/823475* (2013.01); *H01L 23/5226* (2013.01); *H01L 23/5286* (2013.01); *H01L 27/0886* (2013.01); *H01L 29/42392* (2013.01); *H01L 29/456* (2013.01); *H01L 29/665* (2013.01)

(56) References Cited

U.S. PATENT DOCUMENTS

| | | |
|---|---|---|
| 10,438,937 B1 | 10/2019 | Schultz |
| 2005/0212562 A1* | 9/2005 | Gliese ............... H01L 27/11807 326/98 |
| 2007/0157144 A1 | 7/2007 | Mai et al. |
| 2007/0278528 A1 | 12/2007 | Ato et al. |
| 2009/0187871 A1 | 7/2009 | Cork |
| 2010/0148219 A1 | 6/2010 | Shimizu |
| 2013/0087834 A1 | 4/2013 | Park et al. |
| 2013/0126978 A1 | 5/2013 | Becker et al. |
| 2013/0155753 A1 | 6/2013 | Moon et al. |
| 2013/0334613 A1 | 12/2013 | Moroz |
| 2014/0145342 A1 | 5/2014 | Schultz et al. |
| 2014/0264742 A1 | 9/2014 | Yen et al. |
| 2016/0276287 A1 | 9/2016 | Iwabuchi |
| 2017/0011999 A1 | 1/2017 | Heo |
| 2017/0154848 A1* | 6/2017 | Fan ................. H01L 21/823425 |
| 2017/0352649 A1 | 12/2017 | Pant et al. |
| 2018/0090440 A1 | 3/2018 | Schultz et al. |
| 2018/0183414 A1 | 6/2018 | Guo et al. |
| 2019/0065650 A1* | 2/2019 | Pelloie ................ H01L 27/0207 |
| 2019/0155979 A1 | 5/2019 | Schultz |

OTHER PUBLICATIONS

International Search Report and Written Opinion in International Application No. PCT/US2017/052775, dated Mar. 26, 2018, 17 pages.

International Search Report and Written Opinion in International Application No. PCT/US2018/052369, dated Jan. 7, 2019, 16 pages.

Non-Final Office Action in U.S. Appl. No. 15/275,028, dated Sep. 28, 2018, 10 pages.

Non-Final Office Action in U.S. Appl. No. 15/819,879, dated Mar. 18, 2019, 10 pages.

Final Office Action in U.S. Appl. No. 15/275,028, dated May 16, 2019, 12 pages.

Non-Final Office Action in U.S. Appl. No. 15/819,879, dated Jan. 30, 2020, 11 pages.

* cited by examiner

METAL ZERO CONTACT VIA REDUNDANCY ON OUTPUT NODES AND INSET POWER RAIL ARCHITECTURE

CROSS REFERENCE TO RELATED APPLICATIONS

This application is a divisional of U.S. patent application Ser. No. 15/965,311, entitled "METAL ZERO CONTACT VIA REDUNDANCY ON OUTPUT NODES AND INSET POWER RAIL ARCHITECTURE", filed Apr. 27, 2018, the entirety of which is incorporated herein by reference.

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, leakage currents and processing yield are some issues which affect the placement of devices and the routing of signals across an entire die of a semiconductor chip. Additionally, as the transistor dimensions decrease, the short channel effects increase. Other examples of short channel effects other than leakage current are latch-up effects, drain-induced barrier lowering (DIBL), punch-through, performance dependency on temperature, impact ionization, and parasitic capacitance to the silicon substrate and to the wells used for the source and drain regions. Thus, these issues have the potential to delay completion of the design and affect the time to market.

Non-planar transistors are a recent development in semiconductor processing for reducing short channel effects. Tri-gate transistors, Fin field effect transistors (FETs) and gate all around (GAA) transistors are examples of non-planar transistors. These non-planar devices (transistors) are placed in cell layouts, which provide the various functionalities used by the semiconductor chip. The processing steps for non-planar devices (transistors) and other components within the cell layouts are more complex than the processing steps for planar devices.

In some implementations, the cell layout is a custom designed cell created manually. In other cases, the cell layout is generated by a synthesis tool such as a place-and-route (PNR) tool. In either case, due to the complexity of the semiconductor fabrication processing steps for non-planar devices and the decreasing dimensions for the non-planar devices, resistance values increase. When relatively large resistance values for output pins are coupled with relatively large output capacitance values of the interconnect layer routes and gate loading, the output time constant appreciably grows. A relatively large output time constant decreases an amount of time within a clock cycle to perform desired functionality, and so, performance decreases.

In view of the above, efficient methods and systems for creating layout for non-planar cells with redundancy in one or more of output contacts and power contacts are desired.

BRIEF DESCRIPTION OF THE DRAWINGS

The advantages of the methods and mechanisms described herein may be better understood by referring to the following description in conjunction with the accompanying drawings, in which.

Figure 1:
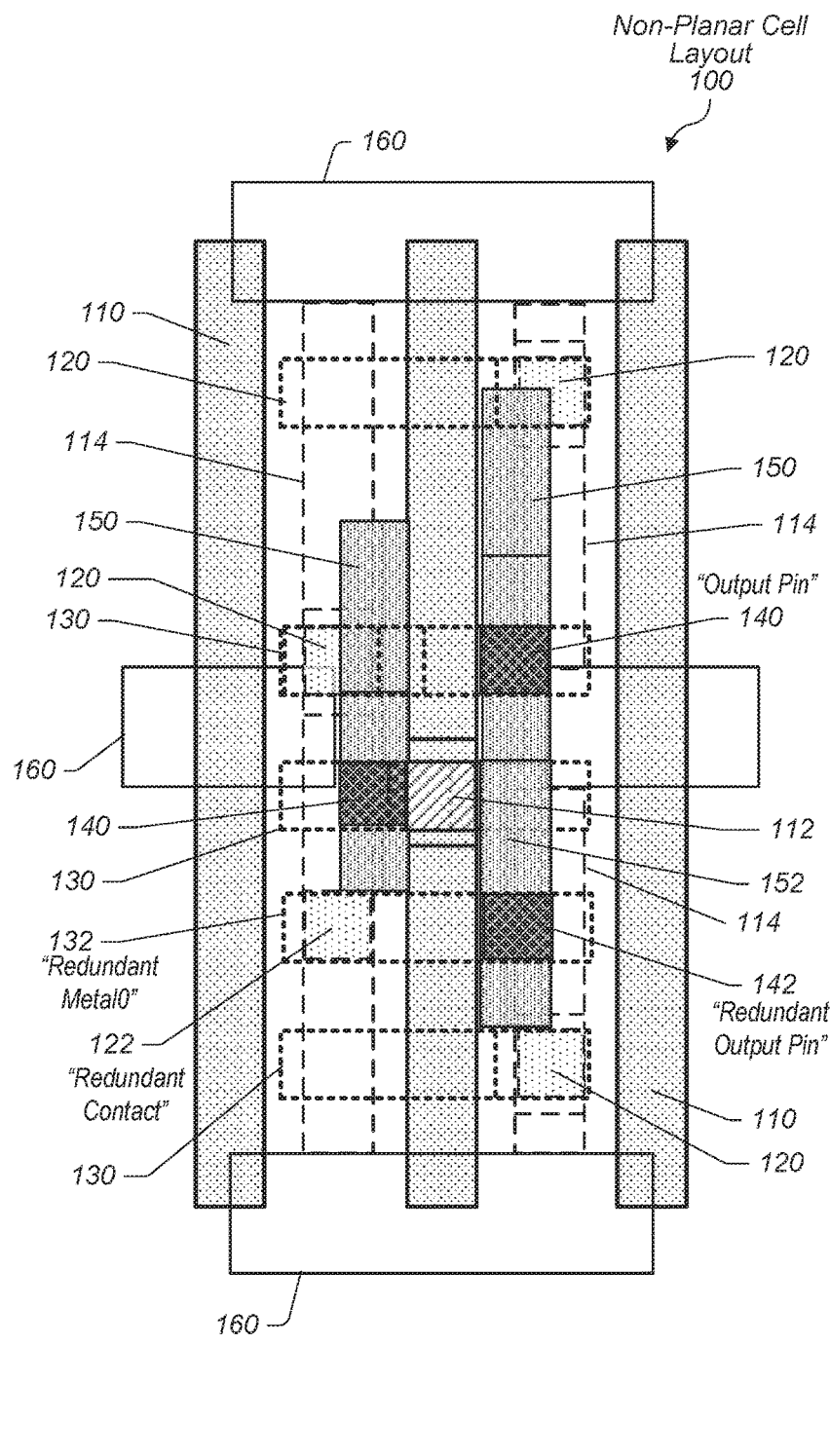
FIG. 1 is a generalized diagram of a top view of a cell layout with non-planar devices and redundancy in output contacts.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems and methods for creating layout for non-planar cells with redundancy in one or more of output contacts and power contacts are contemplated. In some implementations, the cell layout is manually created as a custom cell layout. In other implementations, the cell layout is generated by a synthesis tool such as a place-and-route (PNR) tool. In various implementations, gate metal is placed over non-planar vertical conducting structures. The non-planar vertical conducting structures are used to form non-planar devices (transistors). Examples of non-planar devices are tri-gate transistors, fin field effect transistors (FETs) and gate all around (GAA) transistors. In some implementations, gate contacts connect gate metal to a local interconnect layer. Repeated steps are performed, which include forming contacts and placing corresponding interconnect layers to provide functionality of a first cell.

In an implementation, an available local path in the first cell is identified for redundant output signal routing. For example, in some implementations, the first cell has free tracks to use for signal routes in the metal zero layer in one or more areas such as the top of the cell, the middle of the cell and the bottom of the cell. Redundant metal zero layer is placed in an available metal zero track of the available local path. Redundant contacts and redundant metal one layer are placed in a free track in the available local path to connect an original output contact to a redundant output contact in the first cell. Therefore, yield increases for the output node(s) of the first cell and the output resistance is halved for each output signal with added redundancy. The resistance is further reduced by any additional redundant output contacts placed in the first cell for the same output signal.

In some implementations, an available external path is identified between the first cell and a second cell for redundant power or ground routing. In some cases, a highest metal layer used for a power signal route in a track of the first cell is aligned with a track including a highest metal layer used for a power signal route of the second cell. Therefore, an external connection is made in the external path by extending the highest metal layer for each of the first cell and the second cell.

In other cases, the highest metal layers used for the power signal (or the ground signal) are unaligned between the first cell and the second cell. In an implementation, a power or ground track is selected in each of the first cell and the second cell. Metal zero extension layers and any corresponding contacts are placed in the external path. Additionally, metal one extension layers and any corresponding contacts are placed in the external path. Therefore, yield increases for the power and/or ground connections shared between the first cell and the second cell. In addition, an amount of current flowing through the power and/or ground contacts is reduced.

Figure 2:
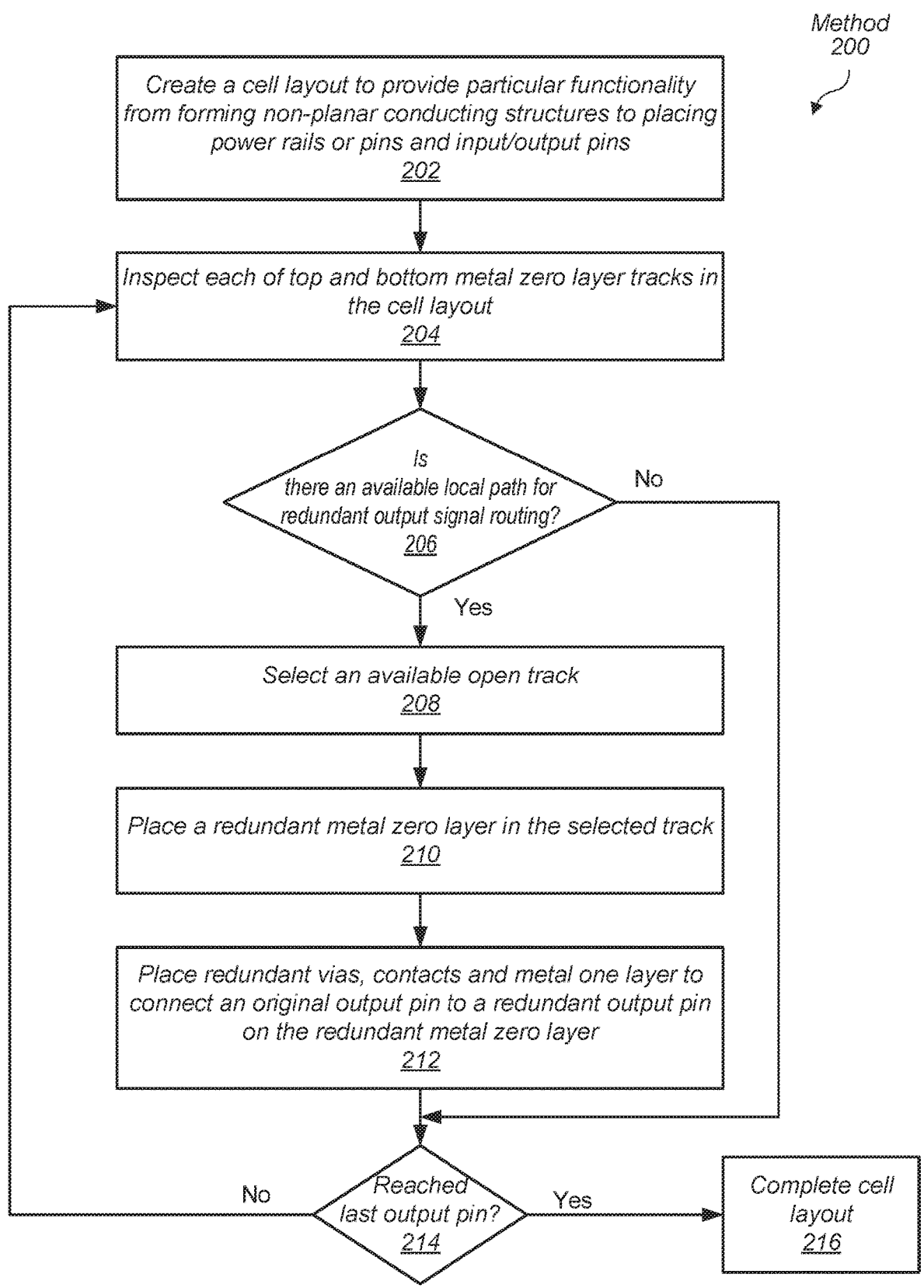
FIG. 2 is a generalized diagram of a method for creating cell layout with non-planar devices and redundancy in output contacts.

In the following description of creating cell layout, FIGS. 1-2 show a top view of a cell layout being fabricated. The top view of the cell layout and the method describe fabricating cell layout with non-planar devices and redundancy in output contacts. Although particular fabrication techniques and materials are described, in various implementations, one a variety of methods and materials are used. The logic gate being shown in the cell layout is an inverter, but in other implementations, any Boolean logic gate or complex gate is used with redundancy in output contacts.

Figure 3:
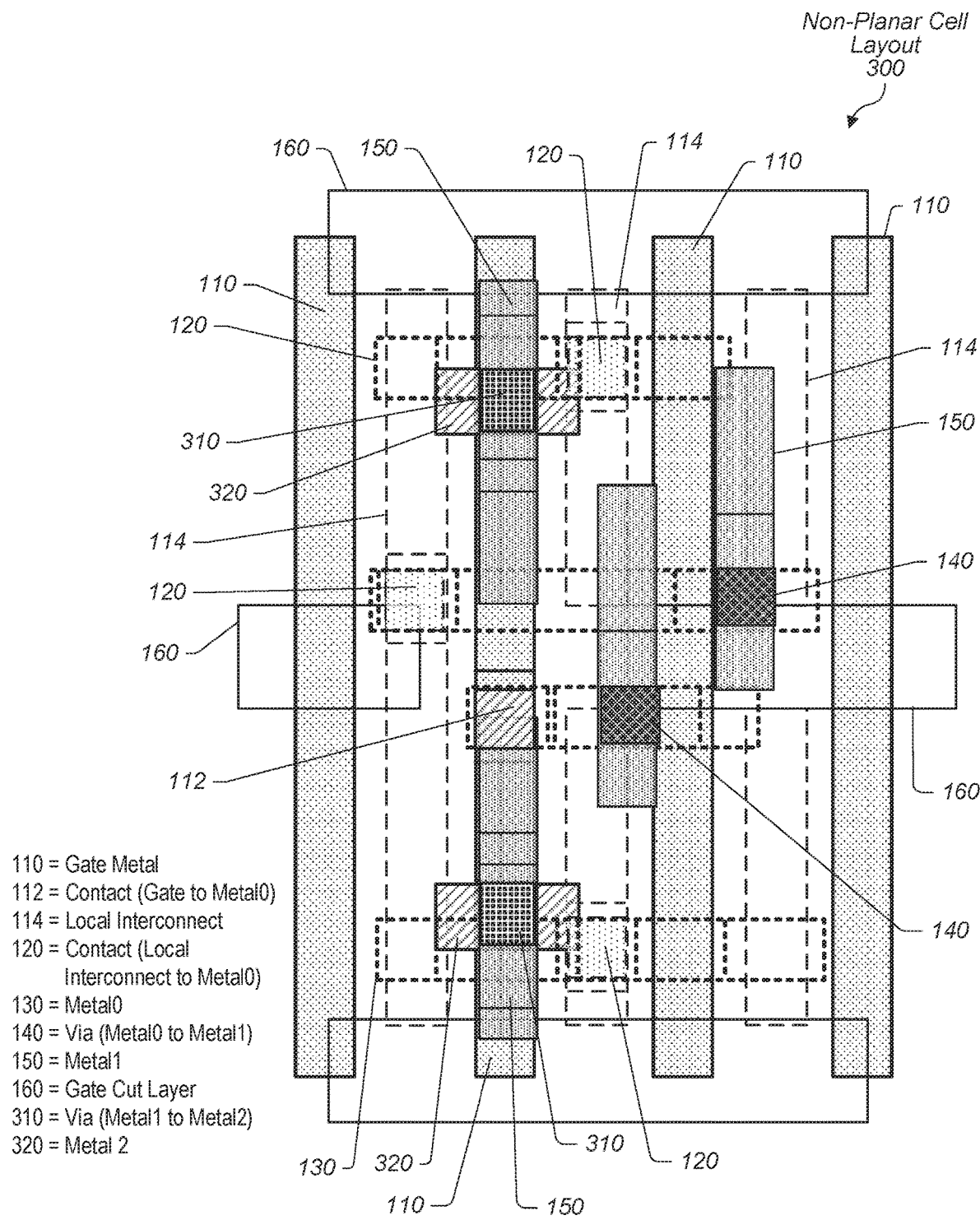
FIG. 3 is a generalized diagram of a top view of a cell layout with non-planar devices.
Figure 4:
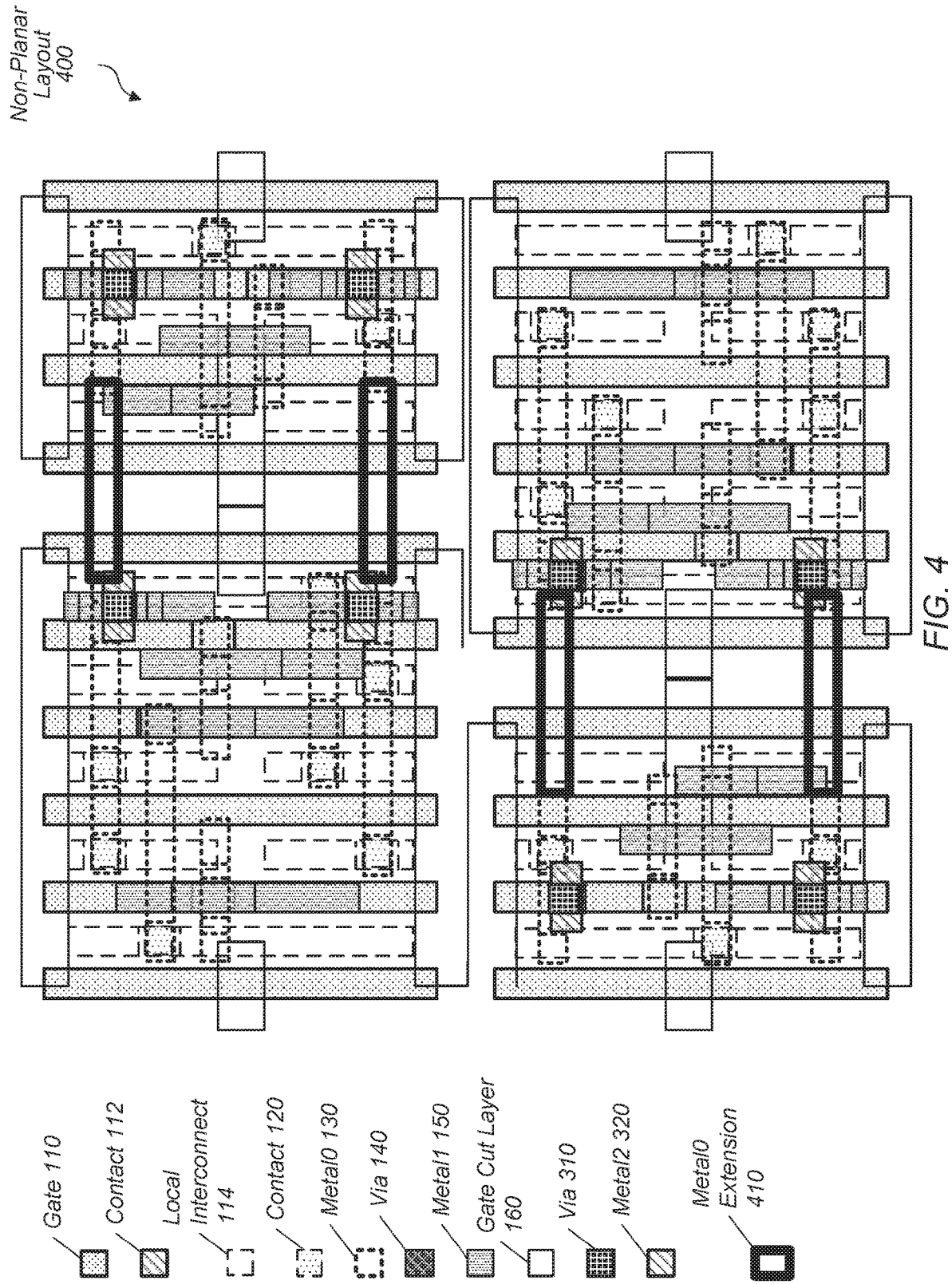
FIG. 4 is a generalized diagram of a top view of a layout for multiple cells with non-planar devices and redundancy in power or ground contacts.
Figure 5:
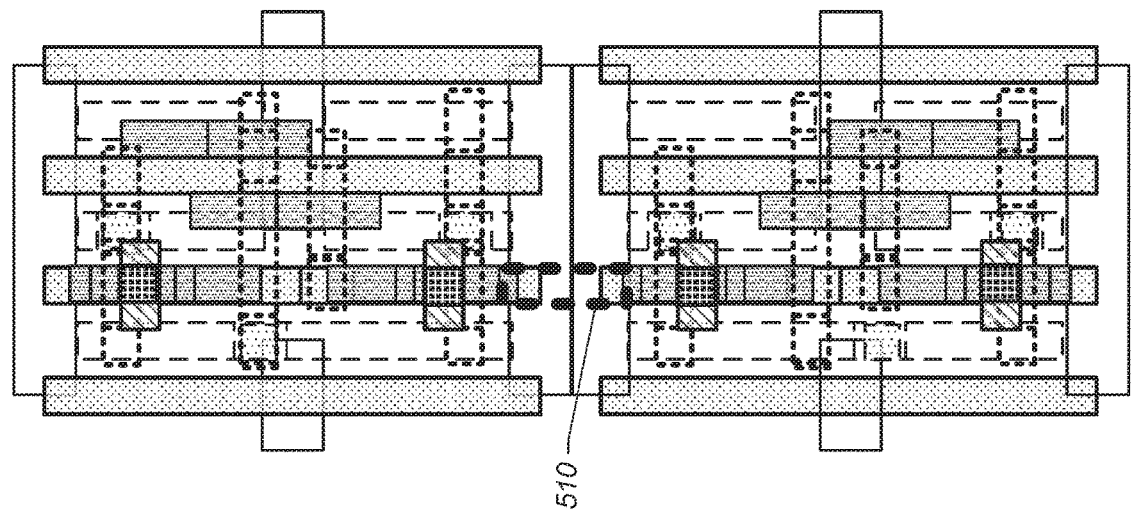
FIG. 5 is a generalized diagram of a top view of a layout for multiple cells with non-planar devices and redundancy in power or ground contacts.
Figure 5:
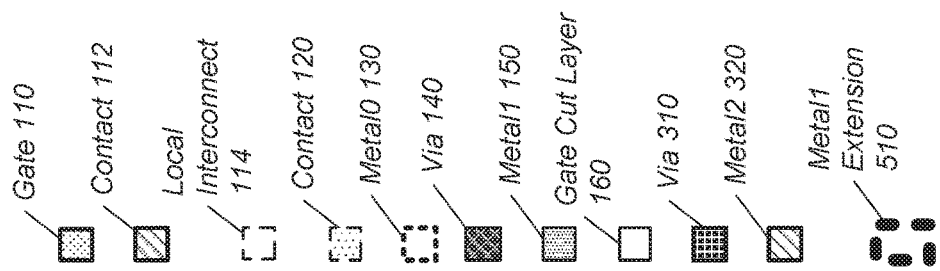
Figure 6:
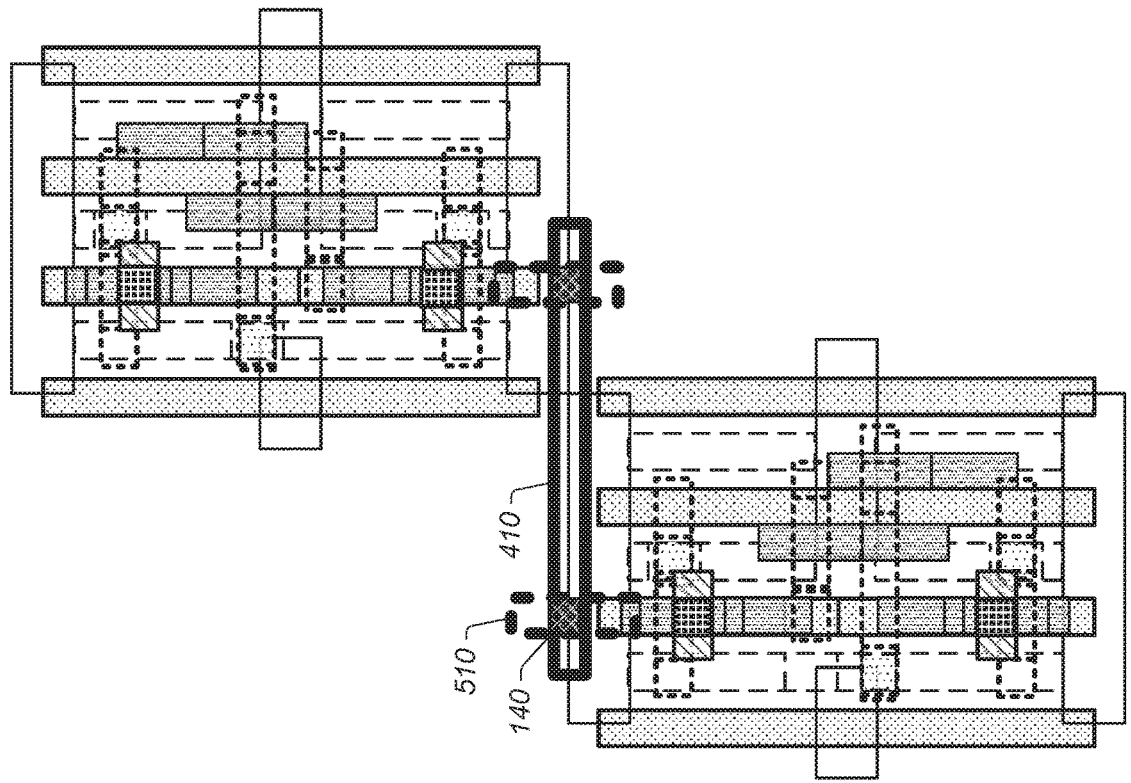
FIG. 6 is a generalized diagram of a top view of a layout for multiple cells with non-planar devices and redundancy in power or ground contacts.
Figure 6:
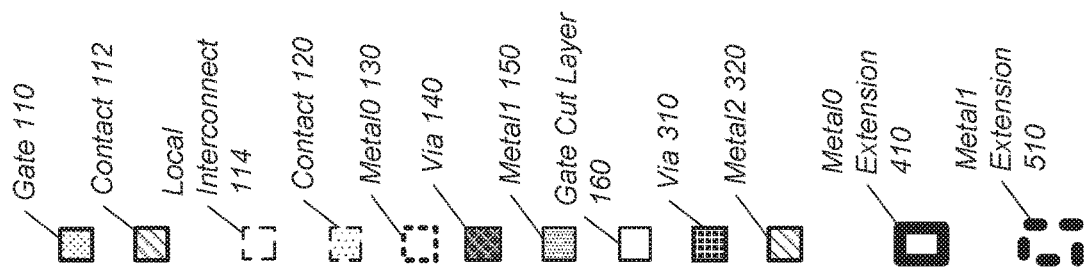
Figure 7:
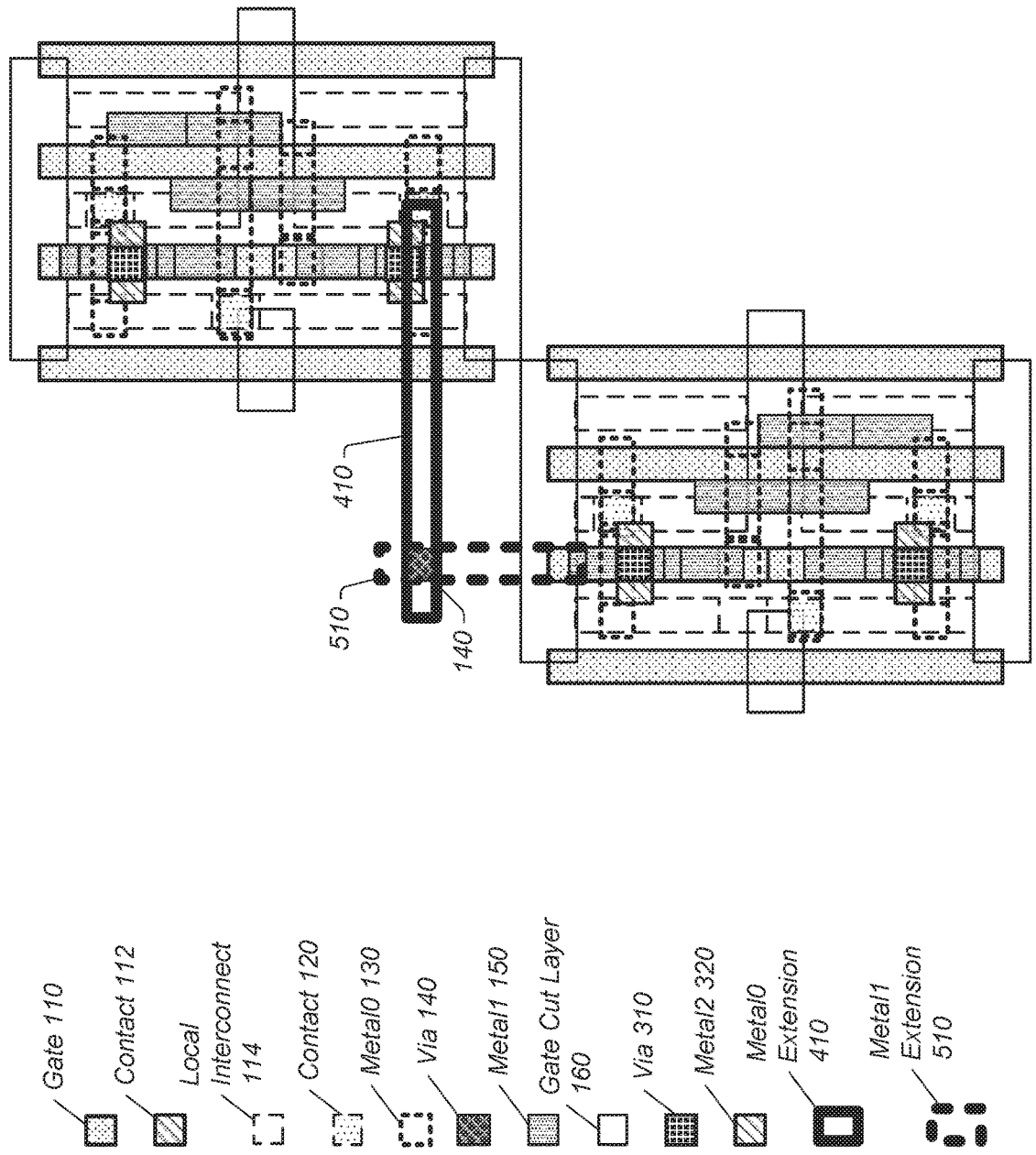
FIG. 7 is a generalized diagram of a top view of a layout for multiple cells with non-planar devices and redundancy in power or ground contacts.
Figure 8:
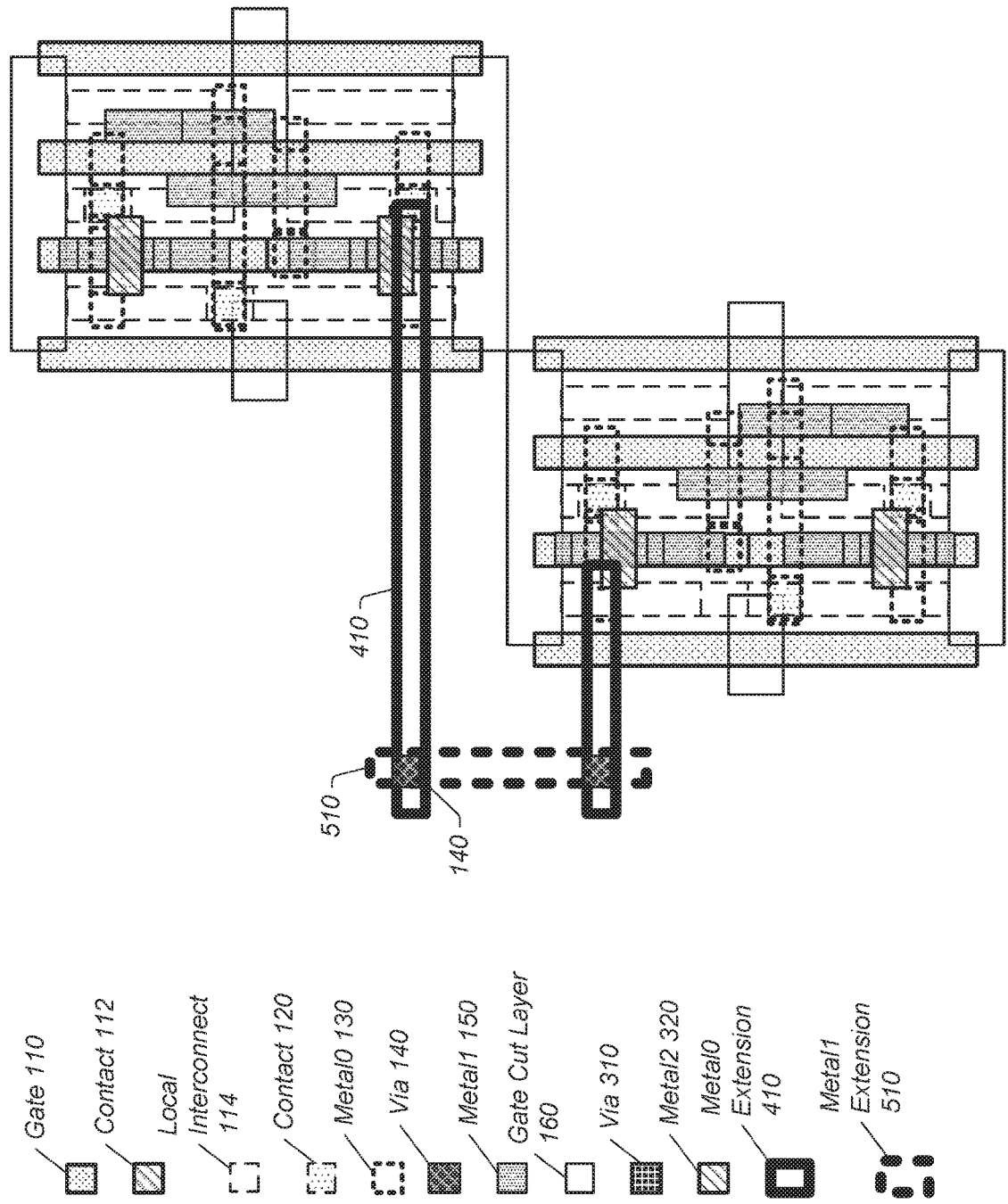
FIG. 8 is a generalized diagram of a top view of a layout for multiple cells with non-planar devices and redundancy in power or ground contacts.
Figure 9:
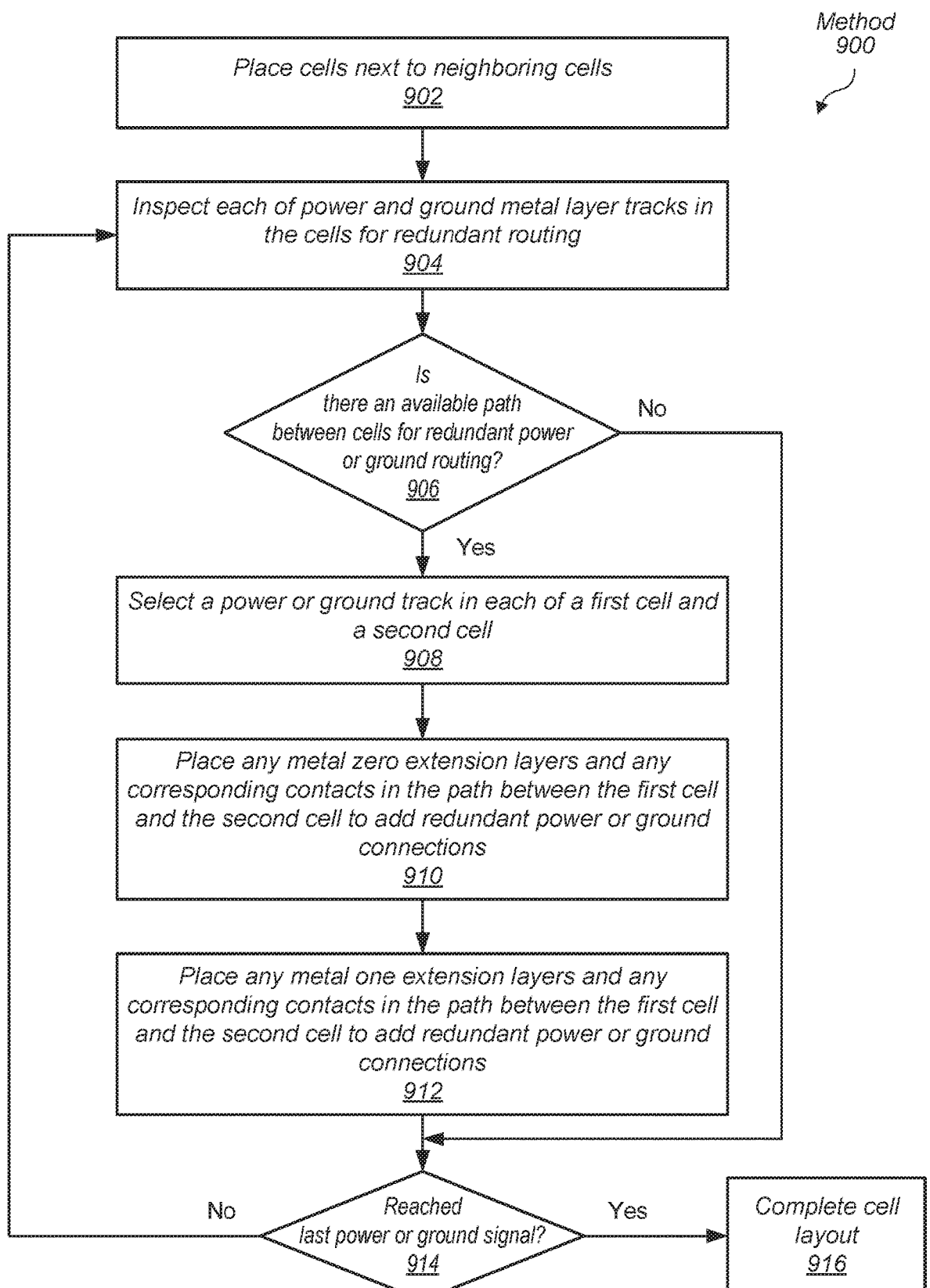
FIG. 9 is a generalized diagram of a method for creating layout with non-planar device and redundancy in power or ground contacts.

In the following description of creating cell layout, FIG. 3 illustrates cell layout for a complex gate with single power and ground pins. FIGS. 4-5 illustrate neighboring cells with aligned tracks for including a highest metal layer used for a power or ground signal. FIGS. 6-8 illustrate neighboring cells with unaligned tracks for including a highest metal layer used for a power or ground signal. FIG. 9 illustrates a method for creating cell layout with non-planar device and redundancy in power or ground contacts Referring to FIG. 1, a generalized block diagram of non-planar cell layout 100, which is a top view of a cell layout with non-planar devices and redundancy in output contacts, is shown. In the illustrated implementation, the p-type metal oxide semiconductor (pmos) field effect transistors (fets) are at the top of cell layout 100. The n-type metal oxide semiconductor (nmos) field effect transistors (fets) are at the bottom of cell layout 100. Here, the active regions are not shown in the cell layout 100 for ease of illustration. In some implementations, cell layout 100 is a custom designed cell created manually. In other cases, cell layout 100 is generated by a synthesis tool such as a place-and-route (PNR) tool.

The logic gate being shown in cell layout 100 is an inverter, but in other implementations, any Boolean logic gate or complex gate is used with redundancy in output contacts. In various implementations, the layout techniques shown in FIGS. 1 and 3-8 are used for a variety of other cells used for a variety of complex gates and functional units. In various implementations, the devices (transistors) in cell layout 100 are non-planar devices (transistors). Non-planar devices are a recent development in semiconductor processing for reducing short channel effects. Tri-gate transistors, Fin field effect transistors (FETs) and gate all around (GAA) transistors are examples of non-planar devices. To create the non-planar devices, cell layout 100 includes non-planar vertical conducting structures (not shown) that come up out of the page in a three-dimensional manner. As used herein, the non-planar vertical conducting structures are also referred to as "vertical structures." It is noted that the vertical structures are considered vertical due to coming out of the page in a three-dimensional manner although the vertical structures are routed in the horizontal direction.

In some implementations, the non-planar devices in cell layout 100 are fabricated by one of the immersion lithography techniques, the double patterning technique, the extreme ultraviolet lithography (EUV) technique, and the directed self-assembly (DSA) lithography technique. In some implementations, the EUV technique provides more flexibility relative to via and contact modules relative to other techniques. As shown, cell layout 100 uses gate metal 110 in a vertical direction. In some implementations, titanium nitride (TiN) is used for the gate metal 110. The layer 160 is used to cut the gate layer and shows where the gate metal 110 start and stop. As shown, each of the first and third columns have separate gates for the top and bottom of the columns due to layer 160.

As shown, cell layout 100 uses trench silicide contacts 114 for the source and drain regions and as local interconnects in the vertical direction. In addition, cell layout 100 uses metal 0 (M0 or metal0 or metal zero) 130 for local interconnections in the horizontal direction and contact 112 for connecting the gate metal 110 to metal0 130 such as for the middle column of gate metal 110. Cell layout 100 additionally uses contacts 120 for connecting the trench silicide contact 114 to metal0 130. Further, cell layout 100 includes metal 1 (M1 or metal1 or metal one) 150 for local interconnections in the vertical direction and vias 140 for connecting the horizontal interconnect metal0 130 to the vertical interconnect metal1 150.

The top-most via 140 is an original output pin for cell layout 100. Due to the complexity of the semiconductor fabrication processing steps for non-planar devices and the decreasing dimensions for the non-planar devices, resistance values increase. When relatively large resistance values for output pins, such as the top-most via 140 in cell layout 100, are coupled with relatively large output capacitance values, the output time constant appreciably grows. A relatively large output time constant decreases an amount of time within a clock cycle to perform desired functionality.

As shown, cell layout 100 has two available local paths for redundant output signal routing. For example, starting from the top of cell layout 100 and moving downward, there is a first available metal zero layer track at the top of cell layout 100 between the top two metal zero layer tracks. Additionally, there is a second available metal zero layer track at the bottom of cell layout 100 between the third and fifth metal zero tracks. In the illustrated implementation, redundant metal0 132 is shown occupying this fourth metal zero track. Redundant contact 122 connects redundant metal0 132 to local interconnect 114. To reach this fourth metal zero track, redundant metal1 152 is placed to extend the existing metal1 150 on the far right of cell layout 100. The metal1 150 connected to the original output pin, such as the top-most via 140 in cell layout 100, is extended by redundant metal1 152 to reach each of redundant metal0 132 and redundant via 142.

Redundant via 142 provides a redundant output pin for cell layout 100. Therefore, yield increases for the output node(s) of cell layout 100 and the output resistance is halved for the output signal due to the added redundancy. The resistance would be further reduced by any additional redundant output vias placed in cell layout 100 for the same output signal. For example, if the top available metal zero layer track is used and another set of redundant contact, redundant metal zero layer, redundant via and redundant metal one layer is used, then the output signal would have one third of its original output contact resistance. In the illustrated implementation, cell layout 100 is an inverter and has one output signal. However, in other implementations, a cell layout has multiple output signals and each has its output resistance reduced through redundancy.

Referring now to FIG. 2, a generalized block diagram of a method 200 for creating cell layout with non-planar devices and redundancy in output contacts is shown. For purposes of discussion, the steps in this implementation (as well as in FIG. 9) are shown in sequential order. However, in other implementations some steps occur in a different order than shown, some steps are performed concurrently, some steps are combined with other steps, and some steps are absent.

A cell layout is created to provide particular functionality from forming non-planar conducting structures to placing power rails or pins and input/output pins (block 202). In some implementations, the cell layout is a custom designed cell created manually. In other cases, the cell layout is generated by a synthesis tool such as a place-and-route (PNR) tool. One of a variety of fabrication techniques and materials are used.

In an implementation, each of the top and bottom metal zero layer tracks is inspected in the cell layout (block 204). In one implementation, the metal zero tracks are inspected by a designer. In another implementation, a software tool with instructions for performing an algorithm, which performs the inspection, is executed. In an implementation, the instructions are added to a PNR tool. In another implementation, the instructions are added to a software tool separate from the PNR tool and executed after completion of the PNR tool for the cell layout or after completion of manual design of the cell layout. In an implementation, a local path in the cell layout for redundant output signal routing begins with an available metal zero layer track. In various implementations, the local path also includes one or more available routes through the available metal zero layer track between local interconnect and a metal one layer track for placement of a redundant output via.

If there is no available local path for redundant output signal routing ("no" branch of the conditional block 206), and the last output pin is reached ("yes" branch of the conditional block 214), then cell layout is completed (block 216). If there is no available local path for redundant output signal routing ("no" branch of the conditional block 206), but the last output pin is not yet reached ("no" branch of the conditional block 214), then control flow of method 200 returns to block 204 where each of top and bottom metal zero layer tracks is inspected in the cell layout. Additionally, local paths through an available metal zero layer track for routing to a redundant output via are searched.

If there is an available local path for redundant output signal routing ("yes" branch of the conditional block 206), then an available open track is selected (block 208). In various implementations, the available track is a metal zero layer track. A redundant metal zero layer is placed in the selected track (block 210). Redundant vias, redundant contacts and redundant metal one layer are placed to connect an original output pin to a redundant output pin on the redundant metal zero layer (block 212). For example, in an implementation, a redundant contact is formed on top of a local interconnect layer in a location within the available metal zero layer track. Next, redundant metal zero is placed in the available metal zero layer track. A redundant via for connecting metal zero to metal one is formed and then redundant metal one is placed to reach the original metal one layer for the output signal.

If the last output pin is not yet reached ("no" branch of the conditional block 214), then control flow of method 200 returns to block 204 where each of top and bottom metal zero layer tracks is inspected in the cell layout. If the last output pin is reached ("yes" branch of the conditional block 214), then cell layout is completed (block 216).

Referring to FIG. 3, a generalized block diagram of non-planar cell layout 300, which is a top view of a cell layout with non-planar devices, is shown. Layout elements described earlier are numbered identically. Although cell layout 300 is shown as a two-dimensional diagram (and layouts 400-800 in FIGS. 4-8), there are three-dimensional elements depicted in the diagrams. As described earlier, vertical structures are used and each of these vertical structures used for non-planar devices is considered vertical due to coming out of the page in a three-dimensional manner although the vertical structures are routed in a horizontal direction relative to other layout elements.

Similar to cell layout 100, active regions are not shown for ease of illustration. In some implementations, cell layout 300 is a custom designed cell created manually. In other cases, cell layout 300 is generated by a synthesis tool such as a PNR tool. The logic gate being shown in cell layout 300 is a complex gate, but in other implementations, any Boolean logic gate or other complex gate used as a candidate cell for placing redundant power or ground contacts is possible and contemplated.

In the illustrated implementation, cell layout 300 includes layout elements used earlier in cell layout 100 and additional elements such as vias 310 for connecting metal1 150 to metal 2 (M2 or metal2 or metal two) 320. In an implementation, the metal2 320 posts are used for power and ground connections at the chip level. In various implementations, external routing from these metal2 320 posts to a neighboring cell is used to provide redundant power and ground connections. The redundant power and ground connections increase yield and reduce an amount of current flowing through the power and/or ground vias 310.

Referring to FIG. 4, a generalized block diagram of non-planar layout 400, which is a top view of multiple cell layouts with non-planar devices and redundancy in power or ground contacts, is shown. Layout elements described earlier are numbered identically. As shown, at the top of layout 400, a copy of two neighboring cells are placed next to one another. Each of two cells provides separate and particular functionality as defined by a designer. In an implementation, power posts in metal2 320 are placed at the top of the two cells and ground posts in metal2 320 are placed at the bottom of the two cells. A copy of the two neighboring cells is mirrored and flipped prior to being instantiated below the top instantiations. Therefore, power posts in metal2 320 are located at the bottom of the two mirrored and flipped cells and ground posts in metal2 320 are located at the top of the two mirrored and flipped cells.

As shown, the horizontal metal0 130 layer connected to a power post in metal2 320 in one cell is aligned with the metal0 130 layer connected to a power post in metal2 320 in the neighboring cell. Similarly, the horizontal metal0 130 layer connected to a ground post in metal2 320 in one cell is aligned with the metal0 130 layer connected to a ground post in metal2 320 in the neighboring cell. In an implementation, a total length of a metal route is determined. The total length is compared to the Blech Length. If the total length is less than the Blech Length, then metal0 extensions 410 are placed in the layout at the chip level. For any given current density, there is a length below which electromigration will not occur. This length is referred to as the Blech Length. Shorter metal routes provide more immunity and designers and researchers seek a critical value of a length-current density product below which no migration occurs. The Blech Length is dependent on the material used for the metal route and the particular analysis selected for determining the Blech Length.

The total length of the metal route between cells in layout 400 is measured as the length of the existing metal0 layer 130 in a cell connected to a power or ground post, the length of a metal0 extension 410 to place between neighboring cells, and the length of the existing metal0 layer 130 connected to a power or ground post in the neighboring cell. The metal0 410 extensions are shown with a bold outline. The metal0 410 extensions are used to provide redundancy for the power and ground connections, which already use the metal2 320 posts for the connections. With the placement of the metal0 410 extensions, yield increases for the power and/or ground connections shared between cells. In addition, an amount of current flowing through the power and/or ground contacts (vias) 310 is reduced.

Referring to FIG. 5, a generalized block diagram of non-planar layout 500, which is a top view of multiple cell layouts with non-planar devices and redundancy in power or ground contacts, is shown. Layout elements described earlier are numbered identically. The cell included in layout 500 provides particular functionality as defined by a designer. In an implementation, power posts in metal2 320 are placed at the top of the cell and ground posts in metal2 320 are placed at the bottom of the cell. A copy of the cell is flipped prior to being instantiated below. Therefore, power posts in metal2 320 are located at the bottom of the flipped cell and ground posts in metal2 320 are located at the top of the flipped cell.

As shown, the vertical metal1 150 layer connected to a ground post in metal2 320 in one cell is aligned with the metal1 150 layer connected to a power post in metal2 320 in the below neighboring (and flipped) cell. In an implementation, a total length of a metal route is determined. The total length is compared to the Blech Length. If the total length is less than the Blech Length, then metal1 extensions 510 is placed in the layout at the chip level.

The total length of the metal route between cells in layout 500 is measured as the length of the existing metal1 layer 150 connected to a ground post in the top cell, the length of a metal1 extension 510 to place between neighboring cells, and the length of the existing metal1 layer 150 connected to a ground post in the below neighboring cell. The metal1 510 extension is shown with a bold outline. The metal1 510 extension is used to provide redundancy for the ground connections, which already use the metal2 320 posts for the connections. With the placement of the metal1 510 extension, yield increases for the ground connections shared between cells. In addition, an amount of current flowing through the ground contacts (vias) 310 is reduced.

Referring to FIG. 6, a generalized block diagram of non-planar layout 600, which is a top view of multiple cell layouts with non-planar devices and redundancy in power or ground contacts, is shown. Layout elements described earlier are numbered identically. The cell included in layout 600 provides particular functionality as defined by a designer. In an implementation, power posts in metal2 320 are placed at the top of the cell and ground posts in metal2 320 are placed at the bottom of the cell. A copy of the cell is flipped and shifted prior to being instantiated below. Therefore, power posts in metal2 320 are located at the bottom of the flipped and shifted cell and ground posts in metal2 320 are located at the top of the flipped and shifted cell.

As shown, the vertical metal1 150 layer connected to a ground post in metal2 320 in one cell is unaligned with the metal1 150 layer connected to a power post in metal2 320 in the below neighboring (and flipped and shifted) cell. In an implementation, a total length of a metal route is determined. The total length is compared to the Blech Length. If the total length is less than the Blech Length, then metal0 410 extensions and metal1 extensions 510 are placed in the layout at the chip level.

The total length of the metal route between cells in layout 600 is measured as the length of the existing metal1 layer 150 connected to a ground post in the top cell, the length of a first metal1 extension 510 to place between neighboring cells, the length of metal0 extension 410 between neighboring cells, and the length of a second metal1 extension 510 to place between neighboring cells, and the length of the existing metal1 layer 150 connected to a ground post in the below neighboring cell. In the illustrated implementation, the metal0 extension 410 is placed between the bottom of the top cell and the top of the bottom cell (flipped and shifted cell).

The metal0 extension 410 and the metal1 extensions 510 are used to provide redundancy for the ground connections, which already use the metal2 320 posts for the connections. With the placement of the metal1 510 extension, yield increases for the ground connections shared between cells. In addition, an amount of current flowing through the ground contacts (vias) 310 is reduced.

Referring to FIG. 7, a generalized block diagram of non-planar layout 700, which is a top view of multiple cell layouts with non-planar devices and redundancy in power or ground contacts, is shown. Layout elements described earlier are numbered identically. Similar to layout 600, a copy of the top cell is flipped and shifted prior to being instantiated below. In this implementation, there is insufficient area for a metal0 extension 410 between the top cell and the bottom cell. In the illustrated implementation, the metal0 extension 410 is placed to the left of the top cell.

The total length of the metal route between cells in layout 700 is measured as the length of the existing metal0 layer 130 connected to a ground post in the top cell, the length of a metal0 extension 410 to place to the left of the top cell, the length of a metal1 extension 510 to place above the bottom cell, and the length of the existing metal1 layer 150 connected to a ground post in the below neighboring cell. When the total length is less than the Blech length, the metal0 extension 410 and the metal1 extension 510 are placed. With the placement of these extensions, yield increases for the ground connections shared between cells. In addition, an amount of current flowing through the ground contacts (vias) 310 is reduced.

Referring to FIG. 8, a generalized block diagram of non-planar layout 800, which is a top view of multiple cell layouts with non-planar devices and redundancy in power or ground contacts, is shown. Layout elements described earlier are numbered identically. Similar to layout 700, a copy of the top cell is flipped and shifted prior to being instantiated below. In this implementation, there is insufficient area for a metal0 extension 410 between the top cell and the bottom cell. Additionally, no metal1 track is available above the bottom cell (flipped and shifted cell). In the illustrated implementation, the metal0 extension 410 is placed to the left of the top cell, but extends past the area directly above the bottom cell.

The total length of the metal route between cells in layout 800 is measured as the length of the existing metal0 layer 130 connected to a ground post in the top cell, the length of the first metal0 extension 410 routed above and past the bottom cell, the length of a metal1 extension 510, the length of the second metal0 extension 410 routed to the left side of the bottom cell, and the length of the existing metal0 layer 130 connected to a ground post in the below neighboring cell. When the total length is less than the Blech length, the two metal0 extensions 410 and the metal1 extension 510 are placed. With the placement of these extensions, yield increases for the ground connections shared between cells. In addition, an amount of current flowing through the ground contacts (vias) 310 is reduced.

Referring now to FIG. 9, a generalized block diagram of a method 900 for creating cell layout with non-planar device and redundancy in power or ground contacts is shown. Cells are placed next to neighboring cells (block 902). Each of the power and ground metal layer tracks is inspected in the cells for redundant routing (block 904). In one implementation, the power and ground metal layer tracks are inspected by a designer. In another implementation, a software tool with instructions for performing an algorithm, which performs the inspection, is executed. In an implementation, the instructions are added to a PNR tool. In another implementation, the instructions are added to a software tool separate from the PNR tool and executed after completion of the PNR tool for the cell layout or after completion of manual design of the cell layout.

In an implementation, an external path in the chip level layout for redundant power or ground signal routing begins with an available metal zero layer track or a metal one layer track. In various implementations, the external path also includes one or more tracks, which are available due to not being used at the chip level, at one or more of the metal zero layer, the metal one layer, and the metal two layer.

If there is no available path between cells for redundant power or ground routing ("no" branch of the conditional block 906), and the last power or ground signal is reached ("yes" branch of the conditional block 914), then cell layout is completed (block 916). If there is no available path between cells for redundant power or ground routing ("no" branch of the conditional block 906), but the last power or ground signal is not yet reached ("no" branch of the conditional block 914), then control flow of method 900 returns to block 904 where each of the power and ground metal layer tracks is inspected in the cells for redundant routing.

If there is an available path between cells for redundant power or ground routing ("yes" branch of the conditional block 906), then a power or ground track in each of a first cell and a second cell is selected (block 908). In an implementation, the selected tracks in the first cell and the second cell is at a same metal layer. In another implementation, the selected tracks in the first cell and the second cell are at different metal layers. Any metal zero extension layers and any corresponding contacts are placed in the path between the first cell and the second cell to add redundant power or ground connections (block 910).

Any metal one extension layers and any corresponding contacts are placed in the path between the first cell and the second cell to add redundant power or ground connections (block 912). In some implementations, only a single metal layer is used between cells at the chip level to add redundant power or ground connections as shown earlier in FIGS. 4-5. In other implementations, multiple metal layers are used between cells at the chip level to add redundant power or ground connections as shown earlier in FIGS. 6-8. Although metal zero layer and metal one layer are shown in earlier illustrated implementations, in other implementations, other metal layers are used such as metal two layer. If the last power or ground signal is not yet reached ("no" branch of the conditional block 914), then control flow of method 900 returns to block 904 where each of the power and ground metal layer tracks is inspected in the cells for redundant routing. If the last power or ground signal is reached ("yes" branch of the conditional block 914), then cell layout is completed (block 916).

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process for creating layout comprising:
    forming one or more non-planar vertical conducting structures on a silicon substrate;
    placing gate metal on a portion of the one or more non-planar vertical conducting structures;
    forming contacts and placing corresponding interconnect layers to provide functionality of a first cell;
    identifying an available local path in the first cell for redundant output signal routing;
    placing redundant metal zero layer in an available metal zero track of the available local path; and
    placing redundant contacts and redundant metal one layer to connect an original output contact to a redundant output contact in the first cell.

2. The semiconductor device fabrication process as recited in claim 1, wherein a highest metal layer used for each of the one or more output contacts is metal one.

3. The semiconductor device fabrication process as recited in claim 1, further comprising:
    identifying an available external path between the first cell and a second cell for redundant power or ground routing;
    selecting a power or ground track in each of the first cell and the second cell; and
    placing any metal zero extension layers and any corresponding contacts in the external path including the selected tracks to add the redundant power or ground routing.

4. The semiconductor device fabrication process as recited in claim 3, further comprising placing any metal one extension layers and any corresponding contacts in the external path to connect a first power or ground contact in the first cell to a second power or ground contact in the second cell.

5. The semiconductor device fabrication process as recited in claim 3, wherein a highest metal layer used for each of the one or more power and ground contacts is metal one.

6. The semiconductor device fabrication process as recited in claim 3, wherein one or more of the first cell and the second cell comprises layout with power and ground connections utilizing contacts instead of end-to-end rails.

7. The semiconductor device fabrication process as recited in claim 3, wherein a highest metal layer used for a power signal route in in a track of the first cell is unaligned with a track comprising a highest metal layer used for a power signal route of the second cell.

* * * * *